United States Patent
Watabe et al.

(10) Patent No.: US 11,081,853 B2
(45) Date of Patent: Aug. 3, 2021

(54) OPTICAL ELEMENT MOVING APPARATUS, NARROWED-LINE LASER APPARATUS, AND METHOD FOR MANUFACTURING ELECTRONIC DEVICE

(71) Applicant: Gigaphoton Inc., Tochigi (JP)

(72) Inventors: Yoshinobu Watabe, Oyama (JP); Masahide Kato, Oyama (JP); Hiroshi Furusato, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/865,537

(22) Filed: May 4, 2020

(65) Prior Publication Data

US 2020/0280161 A1 Sep. 3, 2020

Related U.S. Application Data

(63) Continuation of application No. PCT/JP2017/044076, filed on Dec. 7, 2017.

(51) Int. Cl.
| | |
|---|---|
| *H01S 3/106* | (2006.01) |
| *G03F 7/20* | (2006.01) |
| *G02B 7/02* | (2021.01) |
| *G02B 27/09* | (2006.01) |
| *H01S 3/038* | (2006.01) |

(52) U.S. Cl.
CPC .............. *H01S 3/106* (2013.01); *G02B 7/021* (2013.01); *G02B 27/0955* (2013.01); *G03F 7/2006* (2013.01); *H01S 3/038* (2013.01)

(58) Field of Classification Search
CPC .. G02B 7/021; G02B 27/0955; H04N 5/2254; G03F 7/7006
USPC ..................... 355/67; 359/818–820
See application file for complete search history.

(56) References Cited

U.S. PATENT DOCUMENTS

| | | | | |
|---|---|---|---|---|
| 2010/0060781 A1* | 3/2010 | Yumiki | ................ | G02B 27/646 348/345 |
| 2014/0063296 A1* | 3/2014 | Ohya | ................. | H04N 5/23296 348/240.3 |
| 2018/0123312 A1 | 5/2018 | Furusato et al. | | |

FOREIGN PATENT DOCUMENTS

| | | |
|---|---|---|
| JP | H11-352012 A | 12/1999 |
| WO | 2004/006309 A1 | 1/2004 |
| WO | 2015/133515 A1 | 9/2015 |
| WO | WO-2015133515 A1 * | 9/2015 ............. G02B 7/026 |

(Continued)

OTHER PUBLICATIONS

International Search Report issued in PCT/JP2017/044076; dated Feb. 27, 2018.

(Continued)

*Primary Examiner* — Hung Nguyen
(74) *Attorney, Agent, or Firm* — Studebaker & Brackett PC

(57) ABSTRACT

An optical element moving apparatus includes a first holder configured to hold a first optical element, a second holder configured to hold a second optical element and having an inclination that inclines with respect to a first direction in which the second holder approaches the first holder, a guide section configured to be capable of moving the second holder in a direction parallel to the first direction, and an elastic member disposed in a position which is located between the first holder and the second holder and through which a first plane passes, the first plane intersecting the inclination at right angles and being parallel to the first direction.

11 Claims, 6 Drawing Sheets

(56) References Cited

FOREIGN PATENT DOCUMENTS

WO 2017/026000 A1 2/2017

OTHER PUBLICATIONS

International Preliminary Report on Patentability and Written Opinion issued in PCT/JP2017/044076; dated Jun. 9, 2020.

* cited by examiner

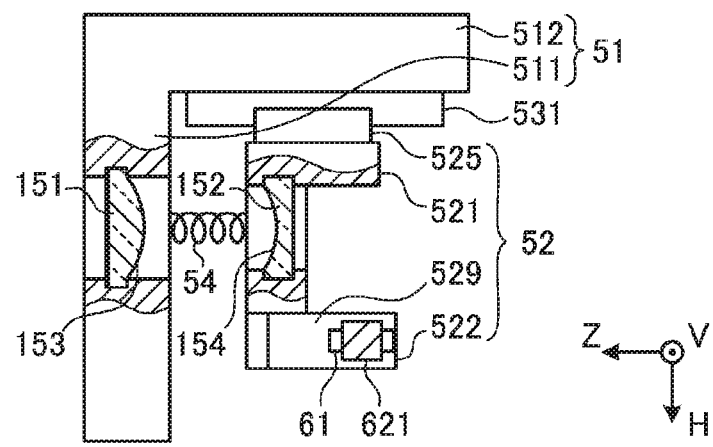
FIG. 2A
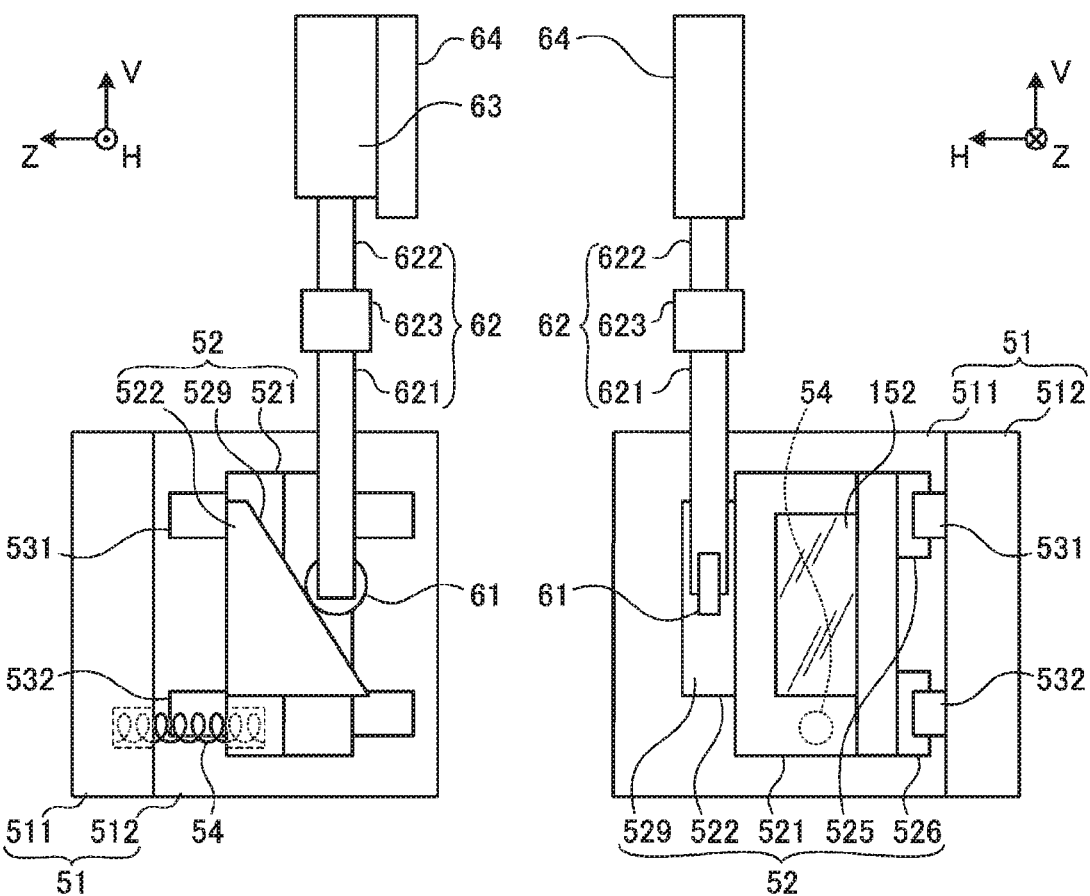
FIG. 2B
FIG. 2C

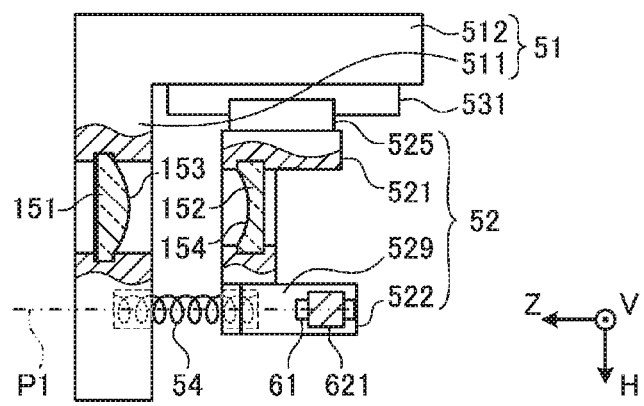
FIG. 3A
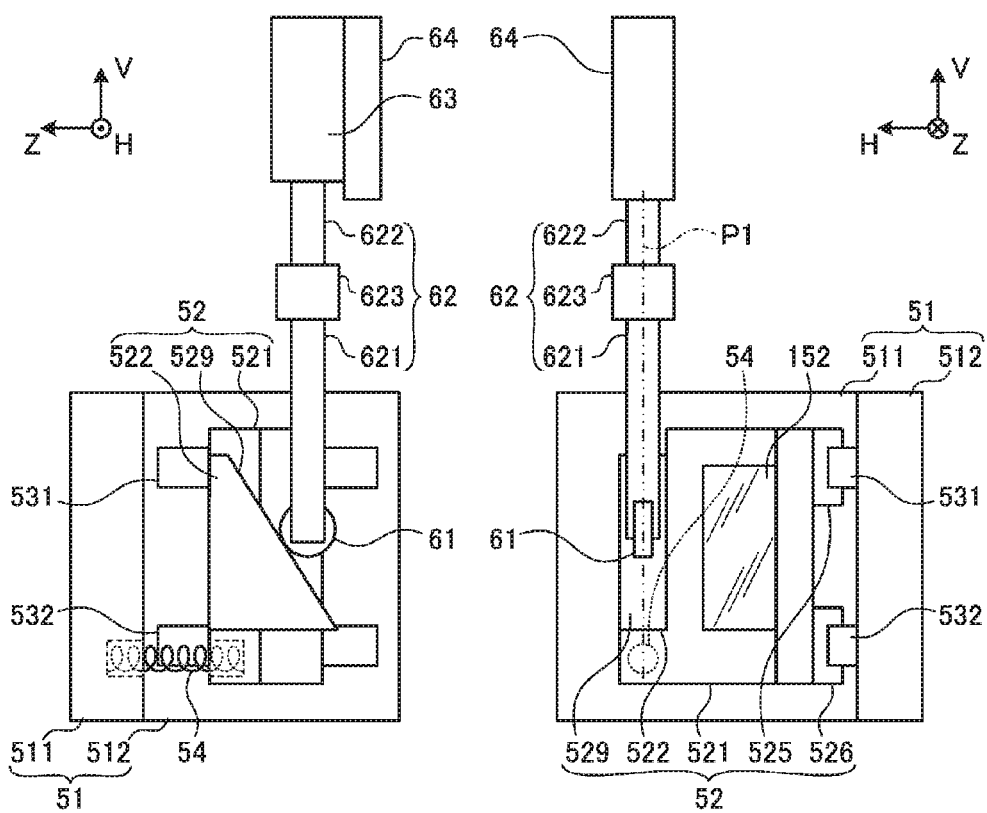
FIG. 3B
FIG. 3C

OPTICAL ELEMENT MOVING APPARATUS, NARROWED-LINE LASER APPARATUS, AND METHOD FOR MANUFACTURING ELECTRONIC DEVICE

CROSS-REFERENCE TO RELATED APPLICATIONS

The present application is a continuation application of International Application No. PCT/JP2017/044076, filed on Dec. 7, 2017, the entire contents of which are hereby incorporated by reference.

BACKGROUND

1. Technical Field

The present disclosure relates to an optical element moving apparatus, a narrowed-line laser apparatus, and a method for manufacturing an electronic device.

2. Related Art

A semiconductor exposure apparatus is required to improve the resolution thereof as a semiconductor integrated circuit is increasingly miniaturized and highly integrated. The semiconductor exposure apparatus is hereinafter referred simply to as an "exposure apparatus." To this end, reduction in the wavelength of the light outputted from a light source for exposure is underway. A gas laser apparatus is used as the light source for exposure in place of a mercury lamp in related art. At present, a KrF excimer laser apparatus, which outputs ultraviolet light having a wavelength of 248 nm, and an ArF excimer laser apparatus, which outputs ultraviolet light having a wavelength of 193 nm, are used as the gas laser apparatus for exposure.

As a current exposure technology, liquid-immersion exposure, in which the gap between the projection lens of the exposure apparatus and a wafer is filled with a liquid, has been put into use. In the liquid-immersion exposure, since the refractive index of the gap between the projection lens and the wafer changes, the apparent wavelength of the light from the light source for exposure is shortened. In the liquid-immersion exposure with an ArF excimer laser apparatus as the light source for exposure, the wafer is irradiated with ultraviolet light having an in-water wavelength of 134 nm. The technology described above is called ArF liquid-immersion exposure. The ArF liquid-immersion exposure is also called ArF liquid-immersion lithography.

Since KrF and ArF excimer laser apparatuses each have a wide spectral linewidth ranging from about 350 to 400 pm in spontaneous oscillation, the chromatic aberrations occur in association with the laser light (ultraviolet light) projected with the size thereof reduced onto the wafer via the projection lens of the exposure apparatus, resulting in a decrease in the resolution. To avoid the decrease in the resolution, the spectral linewidth of the laser light outputted from the gas laser apparatus needs to be narrow enough to make the chromatic aberrations negligible. The spectral linewidth is also called spectral width. A line narrowing module including a line narrowing element is therefore provided in the laser resonator of the gas laser apparatus, and the line narrowing module narrows the spectral width. The line narrowing element may, for example, be an etalon or a grating. A laser apparatus having a narrowed spectral width described above is called a narrowed-line laser apparatus.

CITATION LIST

Patent Literature

[PTL 1] WO 2017/026000

SUMMARY

An optical element moving apparatus according to a viewpoint of the present disclosure includes a first holder configured to hold a first optical element, a second holder configured to hold a second optical element and having an inclination that inclines with respect to a first direction in which the second holder approaches the first holder, a guide section configured to be capable of moving the second holder in a direction parallel to the first direction, and an elastic member disposed in a position which is located between the first holder and the second holder and through which a first plane passes, the first plane intersecting the inclination at right angles and being parallel to the first direction.

A narrowed-line laser apparatus according to another viewpoint of the present disclosure includes a laser resonator, a chamber disposed in the laser resonator and configured to accommodate a laser gas, a pair of electrodes disposed in the chamber, a wavelength selecting element disposed in the laser resonator, and a spectral width changer disposed in the laser resonator. The spectral width changer includes a first optical element, a first holder configured to hold the first optical element, a second optical element, a second holder configured to hold the second optical element and having an inclination that inclines with respect to a first direction in which the second holder approaches the first holder, a guide section configured to be capable of moving the second holder in a direction parallel to the first direction, and an elastic member disposed in a position which is located between the first holder and the second holder and through which a first plane passes, the first plane intersecting the inclination at right angles and being parallel to the first direction.

A method for manufacturing an electronic device according to another viewpoint of the present disclosure includes producing laser light by using a narrowed-line laser apparatus, outputting the laser light to an exposure apparatus, and exposing a light sensitive substrate to the laser light in the exposure apparatus to manufacture the electronic device. The narrowed-line laser apparatus includes a laser resonator, a chamber disposed in the laser resonator and configured to accommodate a laser gas, a pair of electrodes disposed in the chamber, a wavelength selecting element disposed in the laser resonator, and a spectral width changer disposed in the laser resonator. The spectral width changer includes a first optical element, a first holder configured to hold the first optical element, a second optical element, a second holder configured to hold the second optical element and having an inclination that inclines with respect to a first direction in which the second holder approaches the first holder, a guide section configured to be capable of moving the second holder in a direction parallel to the first direction, and an elastic member disposed in a position which is located between the first holder and the second holder and through which a first plane passes, the first plane intersecting the inclination at right angles and being parallel to the first direction.

BRIEF DESCRIPTION OF THE DRAWINGS

An embodiment of the present disclosure will be described below only by way of example with reference to the accompanying drawings.

FIGS. 2A to 2C show a specific configuration of a spectral width changer in Comparative Example.

FIGS. 3A to 3C show a specific configuration of the spectral width changer in a first embodiment of the present disclosure.

DETAILED DESCRIPTION

Figure 1:
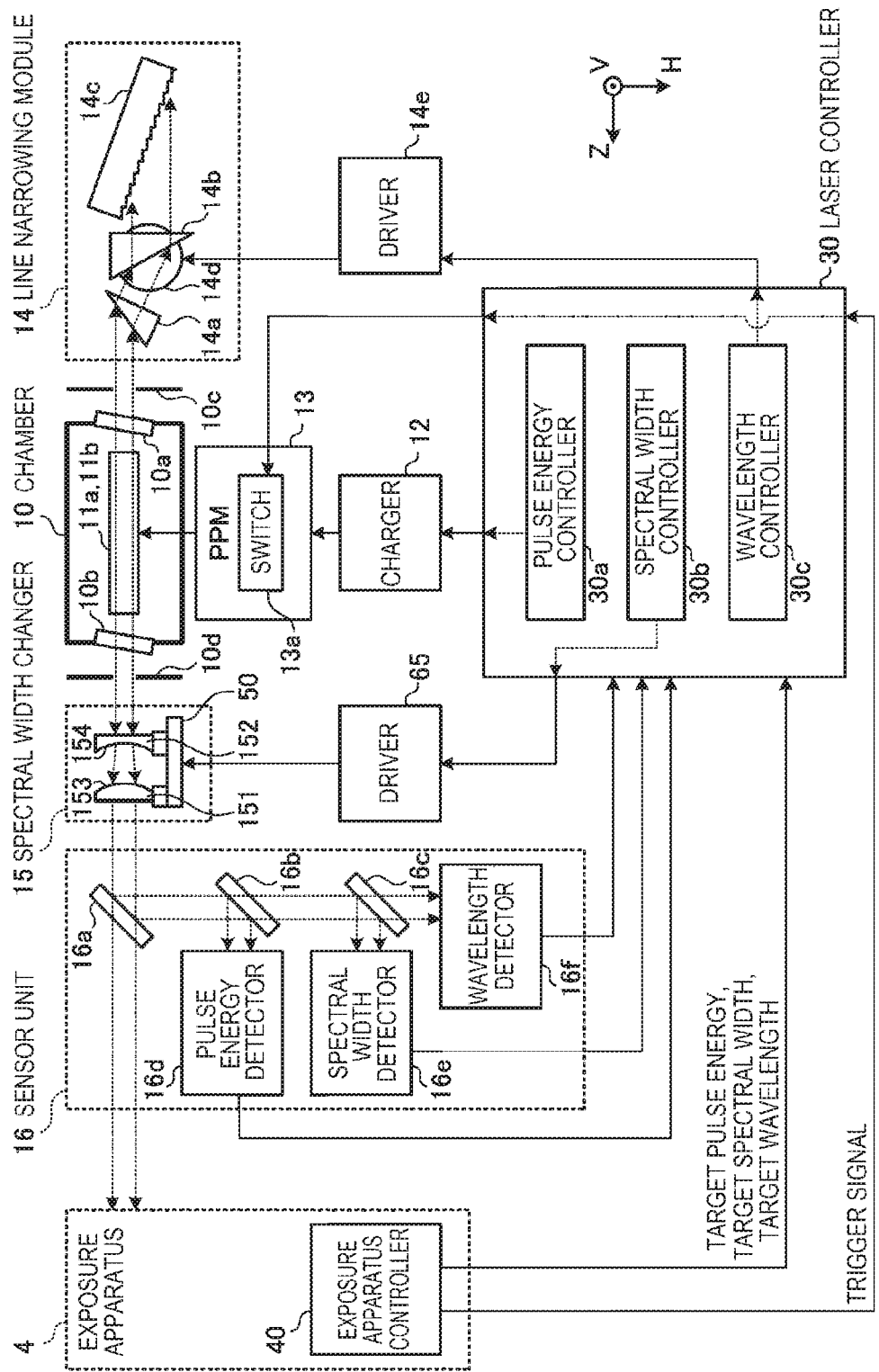
FIG. 1 diagrammatically shows the configuration of a narrowed-line laser apparatus according to Comparison Example.

<Contents>
1. Comparison Example
1.1 Configuration of narrowed-line laser apparatus
1.1.1 Chamber and pulse power module
1.1.2 Laser resonator
1.1.3 Sensor unit
1.1.4 Laser controller
1.2 Operation of narrowed-line laser apparatus
1.2.1 Chamber and pulse power module
1.2.2 Laser resonator
1.2.3 Sensor unit
1.2.4 Laser controller
1.3 Moving apparatus provided in the spectral width changer
1.3.1 Configuration
1.3.2 Operation
1.4 Problems
2. Moving apparatus with elastic member disposed in first plane
2.1 Configuration
2.2 Effects
3. Moving apparatus with elastic member disposed on first straight line
3.1 Configuration
3.2 Effects
4. Moving apparatus with rails that form guide section disposed in first plane
4.1 Configuration
4.2 Effects
5. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Comparison Example 1.1 Configuration of Narrowed-Line Laser Apparatus

FIG. 1 diagrammatically shows the configuration of a narrowed-line laser apparatus according to Comparison Example. The narrowed-line laser apparatus shown in FIG. 1 includes a chamber 10, a pair of discharge electrodes 11a and 11b, a pulse power module (PPM) 13, a line narrowing module 14, and a spectral width changer 15. The narrowed-line laser apparatus further includes a sensor unit 16 and a laser controller 30. The narrowed-line laser apparatus is an excimer laser apparatus configured to output pulsed laser light to enter an external apparatus, such as an exposure apparatus 4.

FIG. 1 shows the narrowed-line laser apparatus viewed in the direction parallel to the direction of discharge between the pair of discharge electrodes 11a and 11b. The discharge electrode 11b is located in a position shifted from the discharge electrode 11a away from the plane of view. The pulsed laser light outputted from the narrowed-line laser apparatus travels in a direction +Z. The direction of the discharge between the pair of discharge electrodes 11a and 11b is a direction +V or −V. The direction −V substantially coincides with the direction of gravity. A direction +H is perpendicular to both the directions +Z and +V. The direction +Z corresponds to a first direction in the present disclosure. The directions +V and −V correspond to a second direction in the present disclosure. In the present disclosure, the terms "parallel" and "perpendicular" are not intended to specify exact values of a direction or an angle but are each intended to tolerate an error within a practical range. The term "parallel" can be replaced with "substantially parallel," and the term "perpendicular" can be replaced with "substantially perpendicular."

1.1.1 Chamber and Pulse Power Module

The chamber 10 is configured to encapsulate a laser gas containing, for example, argon gas or krypton gas as a rare gas, fluorine gas or chlorine gas as a halogen gas, and neon gas or helium gas as a buffer gas.

The pair of discharge electrodes 11a and 11b are disposed in the chamber 10. The pulse power module 13 is connected to the pair of discharge electrodes 11a and 11b. The pulse power module 13 includes a charging capacitor that is not shown and a switch 13a. A charger 12 is connected to the charging capacitor of the pulse power module 13.

Windows 10a and 10b are provided at opposite ends of the chamber 10. The windows 10a and 10b are so disposed that the plane containing the light incident on the windows substantially coincides with the plane HZ and the angle of incidence of the light is substantially equal to Brewster's angle associated with the windows, as shown in FIG. 1.

1.1.2 Laser Resonator

The line narrowing module 14 and the spectral width changer 15 form a laser resonator.

The line narrowing module 14 includes two prisms 14a and 14b and a grating 14c. The prisms 14a and 14b and the grating 14c are each supported by a holder that is not shown. The prisms 14a and 14b and the grating 14c form a wavelength selecting element in the present disclosure.

The prism 14b is so configured that the attitude thereof can be adjusted by a rotary stage 14d, which has an axis of rotation parallel to the direction V. The rotary stage 14d is driven by a driver 14e.

The grating 14c has a surface made of a high-reflectance material, and a large number of grooves are formed in the surface at predetermined intervals. The direction of each of the grooves is parallel to the direction V. A cross section of each of the grooves that is the cross section parallel to the plane HZ has, for example, a right-angled triangular shape.

The spectral width changer 15 is a wavefront changer that is configured to change the wavefront of the laser light in the laser resonator and includes a planoconvex cylindrical lens 151 and a planoconcave cylindrical lens 152. The planoconcave cylindrical lens 152 is disposed in a position closer to the chamber 10 than the planoconvex cylindrical lens 151.

The lenses are so disposed that a cylindrical convex surface 153 of the planoconvex cylindrical lens 151 and a cylindrical concave surface 154 of the planoconcave cylindrical lens 152 face each other. The planoconvex cylindrical lens 151 corresponds to a first optical element in the present disclosure, and the planoconcave cylindrical lens 152 corresponds to a second optical element in the present disclosure.

The center axis of the cylindrical convex surface 153 of the planoconvex cylindrical lens 151 is parallel to the direction V. The flat surface of the planoconvex cylindrical lens 151 is perpendicular to the direction Z. The flat surface of the planoconvex cylindrical lens 151 is coated with a partially reflective film.

The center axis of the cylindrical concave surface 154 of the planoconcave cylindrical lens 152 is parallel to the direction V. The flat surface of the planoconcave cylindrical lens 152 is perpendicular to the direction Z. A moving apparatus 50 is configured to be capable of moving the planoconcave cylindrical lens 152 in the direction +Z or −Z. The moving apparatus 50 is driven by a driver 65.

A beam-width restricting slit plate 10c is disposed between the chamber 10 and the line narrowing module 14. A beam-width restricting slit plate 10d is disposed between the chamber 10 and the spectral width changer 15.

1.1.3 Sensor Unit

The sensor unit 16 includes beam splitters 16a, 16b, and 16c, a pulse energy detector 16d, a spectral width detector 16e, and a wavelength detector 16f.

The beam splitter 16a is disposed in the optical path of the pulsed laser light between the spectral width changer 15 and the exposure apparatus 4. The beam splitter 16a is configured to transmit the pulsed laser light outputted from the spectral width changer 15 at high transmittance and reflect part of the pulsed laser light outputted from the spectral width changer 15.

The beam splitter 16b is disposed in the optical path of the pulsed laser light reflected off the beam splitter 16a. The beam splitter 16b is configured to transmit part of the pulsed laser light reflected off the beam splitter 16a and reflect the remainder of the pulsed laser light reflected off the beam splitter 16a.

The beam splitter 16c is disposed in the optical path of the pulsed laser light having passed through the beam splitter 16b. The beam splitter 16c is configured to transmit part of the pulsed laser light having passed through the beam splitter 16b and reflect the remainder of the pulsed laser light having passed through the beam splitter 16b.

The pulse energy detector 16d is disposed in the optical path of the pulsed laser light reflected off the beam splitter 16b. The pulse energy detector 16d is formed of a photodiode, a photoelectric tube, or a pyroelectric device.

The spectral width detector 16e is disposed in the optical path of the pulsed laser light reflected off the beam splitter 16c. The spectral width detector 16e includes an etalon spectrometer.

The wavelength detector 16f is disposed in the optical path of the pulsed laser light having passed through the beam splitter 16c. The wavelength detector 16f includes an etalon spectrometer.

1.1.4 Laser Controller

The exposure apparatus 4 includes an exposure apparatus controller 40. The exposure apparatus controller 40 is configured to control movement and other actions of a workpiece table WT, which will be described later. The exposure apparatus controller 40 is configured to output data on target pulse energy, data on a target spectral width, data on a target wavelength, and a trigger signal to the laser controller 30.

The laser controller 30 includes a pulse energy controller 30a, a spectral width controller 30b, and a wavelength controller 30c. The pulse energy controller 30a, the spectral width controller 30b, and the wavelength controller 30c are each configured as a program module loaded onto a memory 1002, which is provided in the laser controller 30.

1.2 Operation of Narrowed-Line Laser Apparatus 1.2.1 Chamber and Pulse Power Module The laser controller 30 is configured to receive the trigger signal from the exposure apparatus controller 40. The laser controller 30 is configured to transmit the trigger signal to the pulse power module 13 based on the trigger signal received from the exposure apparatus controller 40.

Upon the reception of the trigger signal from the laser controller 30, the pulse power module 13 is configured to produce pulsed high voltage from electric energy charged in the charger 12 and applies the high voltage between the pair of discharge electrodes 11a and 11b.

When the high voltage is applied between the pair of discharge electrodes 11a and 11b, discharge occurs between the pair of discharge electrodes 11a and 11b. The energy of the discharge excites the laser gas in the chamber 10, and the state of the laser gas transitions to a high energy level. When the excited laser gas then transitions to a lower energy level, the laser gas emits light having a wavelength according to the difference between the energy levels.

The light produced in the chamber 10 exits out of the chamber 10 via the windows 10a and 10b.

1.2.2 Laser Resonator

The prisms 14a and 14b expand the H-direction beam width of the light having exited via the window 10a of the chamber 10 and cause the expanded light to be incident on the grating 14c. The prisms 14a and 14b also reduce the H-direction beam width of the light reflected off the grating 14c and cause the narrowed light to return into the discharge space of the chamber 10 via the window 10a.

The grating 14c is configured to diffract the light incident thereon via the prisms 14a and 14b in the plane parallel to the plane HZ and in the direction according to the wavelength of the light. The grating 14c is disposed in the Littrow arrangement, which causes the angle of incidence of the light incident on the grating 14c via the prisms 14a and 14b to coincide with the angle of diffraction of the diffracted light having a desired wavelength. The light having a wavelength close to the desired wavelength thus returns into the chamber 10 via the prisms 14a and 14b.

The rotary stage 14d adjusts the attitude of the prism 14b to change the angle of incidence of the light incident on the grating 14c via the prisms 14a and 14b. The wavelength of the light selected by the line narrowing module 14 is thus changed.

The spectral width changer 15 including the planoconvex cylindrical lens 151 is configured to transmit and output part of the light having exited via the window 10b of the chamber 10 and reflect the remainder back into the chamber 10.

The light having exited out of the chamber 10 thus travels back and forth between the line narrowing module 14 and the spectral width changer 15. The light is amplified whenever passing through the discharge space between the pair of discharge electrodes 11a and 11b. The light undergoes the line narrowing whenever deflected back off the line narrowing module 14. Further, the arrangement of the windows 10a and 10b described above allows selection of the polarized component in the direction H. The light having been emitted as a result of the laser oscillation and having undergone the line narrowing is thus outputted as the laser light from the spectral width changer 15.

When the moving apparatus 50 moves the planoconcave cylindrical lens 152 in the direction +Z or −Z, the light caused to return from the spectral width changer 15 into the chamber 10 changes in terms of the shape of the wavefront in a cross section parallel to the plane HZ. The wavefront of the light incident on the grating 14c thus changes, so that the spectral width of the light selected by the line narrowing module 14 is changed.

1.2.3 Sensor Unit

The pulse energy detector 16d, which is provided in the sensor unit 16, is configured to detect the pulse energy of the pulsed laser light reflected off the beam splitter 16b. The pulse energy detector 16d is configured to output data on the detected pulse energy to the laser controller 30.

The spectral width detector 16e, which is provided in the sensor unit 16, is configured to detect the spectral width of the pulsed laser light reflected off the beam splitter 16c. The spectral width detector 16e is configured to output data on the detected spectral width to the laser controller 30.

The wavelength detector 16f, which is provided in the sensor unit 16, is configured to detect the wavelength of the pulsed laser light having passed through the beam splitter 16c. The wavelength detected with the wavelength detector 16f may be a peak wavelength or a centroid wavelength or may be the average of two wavelengths at the value half the peak value. The wavelength detector 16f is configured to output data on the detected wavelength to the laser controller 30.

1.2.4 Laser Controller

The pulse energy controller 30a, which is provided in the laser controller 30, is configured to set charging voltage at the charger 12 based on the data on the pulse energy received from the pulse energy detector 16d and the data on the target pulse energy received from the exposure apparatus controller 40. The pulse energy of the pulsed laser light outputted from the narrowed-line laser apparatus thus approaches the target pulse energy.

The spectral width controller 30b, which is provided in the laser controller 30, is configured to control the spectral width changer 15 via the driver 65 based on the spectral width data received from the spectral width detector 16e and the target spectral width data received from the exposure apparatus controller 40. The spectral width of the pulsed laser light outputted from the narrowed-line laser apparatus thus approaches the target spectral width.

The wavelength controller 30c, which is provided in the laser controller 30, is configured to control the rotary stage 14d via the driver 14e based on the wavelength data received from the wavelength detector 16f and the target wavelength data received from the exposure apparatus controller 40. The wavelength of the pulsed laser light outputted from the narrowed-line laser apparatus thus approaches the target wavelength.

1.3 Moving Apparatus Provided in the Spectral Width Changer

1.3.1 Configuration

FIGS. 2A to 2C show a specific configuration of the spectral width changer 15 in Comparative Example. FIG. 2A is a partial cross-sectional view of the spectral width changer 15 viewed along the direction −V and corresponds to a view of the spectral width changer 15 viewed in the same direction as in FIG. 1. FIG. 2B shows the spectral width changer 15 viewed along the direction −H. FIG. 2C shows the spectral width changer 15 viewed along the direction +Z.

The moving apparatus provided in the spectral width changer 15 includes a first holder 51, a second holder 52, a first rail 531, a second rail 532, and an elastic member 54.

The first holder 51 includes a lens holder 511 and a rail holder 512. The first holder 51 is formed in a substantially L-letter shape formed of the lens holder 511 and the rail holder 512, as shown in FIG. 2A. The lens holder 511 is configured to hold an end portion of the planoconvex cylindrical lens 151. The rail holder 512 is configured to hold the first rail 531 and the second rail 532, which form a guide section.

The longitudinal direction of each of the first rail 531 and the second rail 532 is parallel to the direction Z.

The second holder 52 includes a lens holder 521, an inclination constituting section 522, a first guide follower 525, and a second guide follower 526. The lens holder 521 is configured to hold an end portion of the planoconcave cylindrical lens 152. The inclination constituting section 522 is located on the +H-direction-side of the lens holder 521. The inclination constituting section 522 has an inclination 529. The inclination 529 inclines with respect to both the directions V and Z but is parallel to the direction H. The first guide follower 525 and the second guide follower 526 are located on the −H-direction side of the lens holder 521. The first guide follower 525 is configured to move along the first rail 531. The second guide follower 526 is configured to move along the second rail 532.

The elastic member 54 is formed, for example, of a coil spring. The elastic member 54 is located between the lens holder 511 of the first holder 51 and the lens holder 521 of the second holder 52. To specify the positions of the opposite ends of the elastic member 54, recesses that accommodate end portions of the elastic member 54 are formed in the lens holders 511 and 521.

The moving apparatus provided in the spectral width changer 15 further includes a wheel 61, a rod section 62, an actuator 63, and a fixed section 64.

The wheel 61 is located at the front end of the rod section 62. The wheel 61 is configured to be rotatable around an axis of rotation parallel to the direction H. The rod section 62 includes a first rod 621, a second rod 622, and a link 623. The wheel 61 is supported by the front end of the first rod 621. The second rod 622 is supported by the actuator 63. The link 623 links the first rod 621 and the second rod 622 to each other. The longitudinal direction of the rod 62 is parallel to the direction V. The link 623 is configured to be capable of manual adjustment of the length of the rod section 62.

The actuator 62 is supported by the fixed section 64. The fixed section 64 is fixed relative to the first holder 51 by a member that is not shown. The actuator 63 is configured to be capable of moving the rod section 62 and the wheel 61 relative to the fixed section 64 in the directions +V and −V. For example, the actuator 63 is configured to be capable of moving the rod section 62 and the wheel 61 in such a way that the wheel 61 comes into contact with the inclination 529. The actuator 63 is driven by the driver 65 described above.

1.3.2 Operation

When the inclination 529 is pressed, the second holder 52 moves along the first rail 531 and the second rail 532. The direction in which the second holder 52 moves when the inclination 529 is pressed is the direction in which the second holder 52 approaches the first holder 51, that is, the direction +Z. The planoconcave cylindrical lens 152 thus moves in the direction toward the planoconvex cylindrical lens 151. The elastic member 54 is compressed in this process.

When the pressing force against the inclination 529 is relaxed, the repulsive force exerted by the elastic member 54 moves the second holder 52 in the direction −Z along the first rail 531 and the second rail 532. The planoconcave cylindrical lens 152 thus moves in the direction away from the planoconvex cylindrical lens 151.

The force that presses the inclination 529 is exerted by the actuator 63 to the inclination 529 via the rod section 62 and the wheel 61. When the actuator 63 moves the wheel 61 in the direction −V, the inclination 529 is pressed, and the second holder 52 and the planoconcave cylindrical lens 152 move in the direction +Z. When the actuator 63 moves the wheel 61 in the direction +V, the repulsive force exerted by the elastic member 54 moves the second holder 52 and the planoconcave cylindrical lens 152 in the direction −Z. The configuration in which the movement direction of the wheel 61 is perpendicular to the movement direction of the planoconcave cylindrical lens 152 allows improvement in flexibility of the arrangement of the actuator 63.

1.4 Problems

When the planoconcave cylindrical lens 152 is moved, the first rail 531 and the second rail 532 restrict the attitude of the planoconcave cylindrical lens 152. That is, the center axis of the cylindrical concave surface 154 is substantially maintained to be parallel to the direction V, and the flat surface of the planoconcave cylindrical lens 152 is substantially maintained to be perpendicular to the direction Z.

An attempt of moving the second holder 52 at high speed to control the spectral linewidth at high speed, however, increases the load acting on the second holder 52. The second holder 52 is elastically deformed in some cases. When the second holder 52 is elastically deformed, the attitude of the planoconcave cylindrical lens 152 changes in some cases.

In particular, when a change in the attitude of the planoconcave cylindrical lens 152 includes a component of rotation around an axis parallel to the direction V, the angle of incidence of the light incident on the grating 14c changes. The wavelength of the light selected by the line narrowing module 14 therefore changes. It is desirable that the wavelength controller 30c controls the line narrowing module 14 in such a way that a change in the wavelength resulting from a change in the attitude of the planoconcave cylindrical lens 152 falls within a desired range.

To control the spectral linewidth at high speed, however, in some cases, the control performed by the line narrowing module 14 cannot keep up with a change in the wavelength resulting from a change in the attitude of the planoconcave cylindrical lens 152.

In an embodiment described below, a change in the attitude of the planoconcave cylindrical lens 152 is reduced to achieve high-precision control of the beam characteristics.

2. Moving Apparatus with Elastic Member Disposed in First Plane 2.1 Configuration FIGS. 3A to 3C show a specific configuration of the spectral width changer 15 in a first embodiment of the present disclosure. FIG. 3A is a partial cross-sectional view of the spectral width changer 15 viewed along the direction −V and corresponds to a view of the spectral width changer 15 viewed in the same direction as in FIGS. 1 and 2A. FIG. 3B shows the spectral width changer 15 viewed along the direction −H and corresponds to a view of the spectral width changer 15 viewed in the same direction as in FIG. 2B. FIG. 3C shows the spectral width changer 15 viewed along the direction +Z and corresponds to a view of the spectral width changer 15 viewed in the same direction as in FIG. 2C.

The spectral width changer 15 in the first embodiment includes the same components as those of the spectral width changer 15 in Comparative Example described with reference to FIGS. 2A to 2C. The spectral width changer 15 in the first embodiment differs from the spectral width changer 15 in Comparative Example in terms of the position of the elastic member 54.

In the first embodiment, a plane that intersects the inclination 529 at right angles but is parallel to the direction Z is called a first plane P1. The first plane P1 is parallel to the plane VZ. FIGS. 3A to 3C show that the first plane P1 intersects the inclination 529 at the center of the inclination 529, but not necessarily in the present disclosure. The first plane P1 may be a plane that intersects the inclination 529 in any position on the inclination 529 and is parallel to the direction Z.

In the first embodiment, the elastic member 54 is disposed in a position through which the first plane P1 passes. In accordance with the arrangement described above, the positions of the recesses formed in the lens holders 511 and 521 to accommodate the end portions of the elastic member 54 also differ from the positions of the recesses in Comparative Example.

The other points in the first embodiment are the same as those in Comparative Example.

2.2 Effects

The second holder 52 receives the pressing force from the wheel 61 and the repulsive force from the elastic member 54. The forces change in accordance with the amount of displacement of the second holder 52, the acceleration acting on the second holder 52, and other factors. In Comparative Example described above, the lines of action of the forces are located in planes separate from each other but parallel to the plane VZ. That is, in Comparative Example, the lines of action of the forces are located in planes different from each other in the direction H. Therefore, a couple around an axis parallel to the direction V is produced in the second holder 52 in accordance with changes in the forces. The attitude of the planoconcave cylindrical lens 152 around an axis parallel to the direction V therefore changes, and the wavelength of the light selected by the line narrowing module 14 changes accordingly in some cases.

In contrast, the elastic member 54 is disposed in a position through which the first plane P1 passes in the first embodiment. As a result, the line of action of the pressing force that the wheel 61 exerts to the second holder 52 and the line of action of the repulsive force that the elastic member 54 exerts to the second holder 52 are located in substantially the same plane parallel to the plane VZ. The couple around an axis parallel to the direction V in the second holder 52 is therefore reduced. Therefore, even when the second holder 52 is elastically deformed so that the attitude of the planoconcave cylindrical lens 152 changes, the component of rotation around an axis parallel to the direction V is reduced. A change in the wavelength of the light selected by the line narrowing module 14 is thus reduced.

Figure 4A:
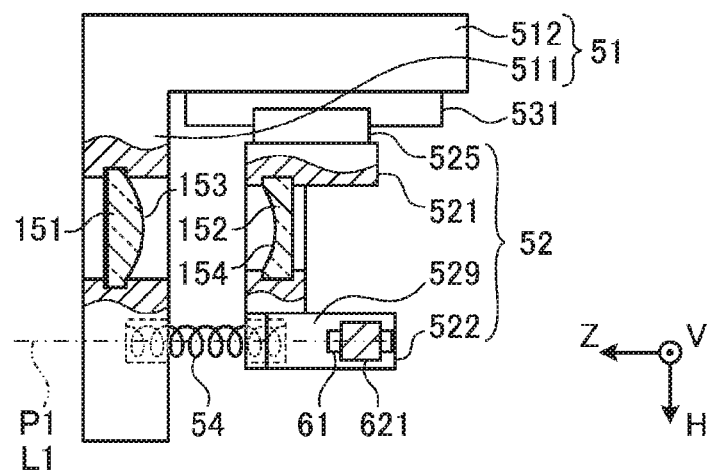
FIGS. 4A to 4C show a specific configuration of the spectral width changer in a second embodiment of the present disclosure.
Figure 4B:
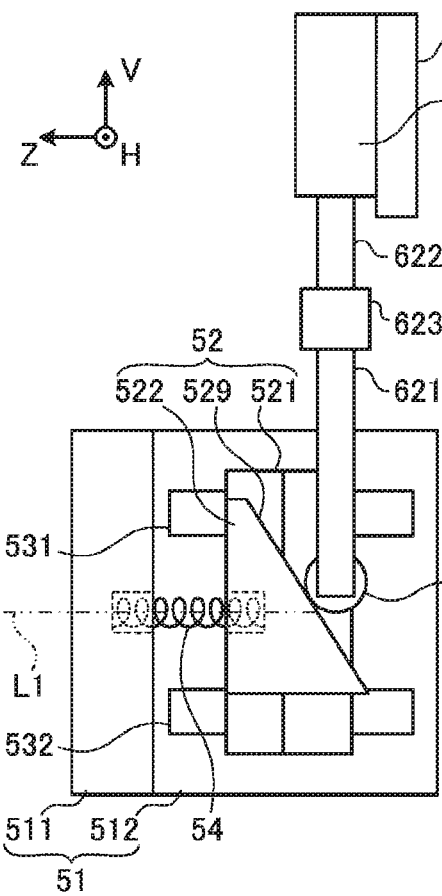
Figure 4C:
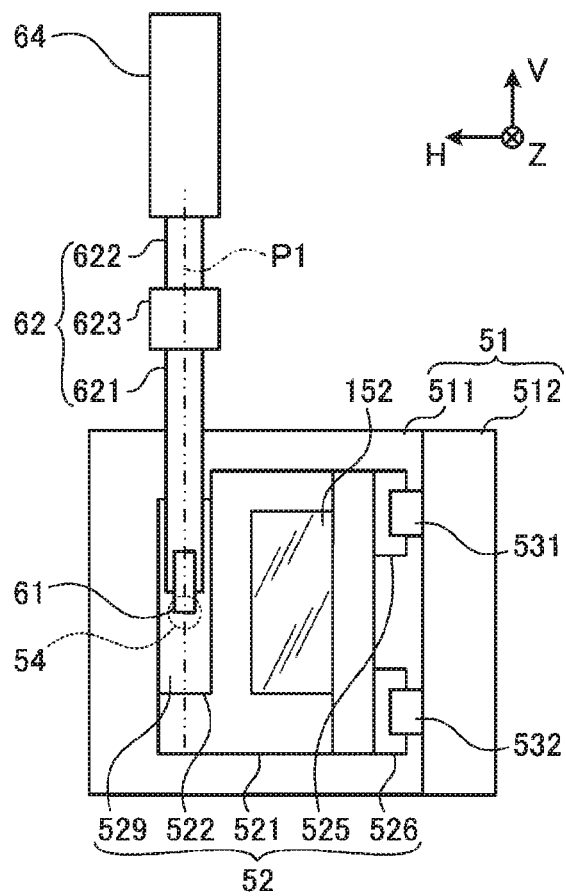

3. Moving Apparatus with Elastic Member Disposed on First Straight Line 3.1 Configuration FIGS. 4A to 4C show a specific configuration of the spectral width changer 15 in a second embodiment of the present disclosure. FIG. 4A is a partial cross-sectional view of the spectral width changer 15 viewed along the direction -V and corresponds to a view of the spectral width changer 15 viewed in the same direction as in FIGS. 1, 2A, and, 3A. FIG. 4B shows the spectral width changer 15 viewed along the direction -H and corresponds to a view of the spectral width changer 15 viewed in the same direction as in FIGS. 2B and 3B. FIG. 4C shows the spectral width changer 15 viewed along the direction +Z and corresponds to a view of the spectral width changer 15 viewed in the same direction as in FIGS. 2C and 3C.

The spectral width changer 15 in the second embodiment includes the same components as those of the spectral width changer 15 in Comparative Example described with reference to FIGS. 2A to 2C and the spectral width changer 15 in the first embodiment described with reference to FIGS. 3A to 3C. The spectral width changer 15 in the second embodiment differs from the spectral width changers 15 in Comparative Example and the first embodiment in terms of the position of the elastic member 54.

In the second embodiment, a straight line that intersects the inclination 529 and is parallel to the direction Z is called a first straight line L1. The first straight line L1 is located in the first plane P1, as shown in FIG. 4A. FIGS. 4A and 4B show that the first straight line L1 intersects the inclination 529 in a position slightly shifted from the center of the inclination 529 in the directions -V and -Z, but not necessarily in the present disclosure. The first straight line L1 may be a straight line that intersects the inclination 529 in any position on the inclination 529 and is parallel to the direction Z.

In the second embodiment, the elastic member 54 is disposed in a position through which the first straight line L1 passes. In accordance with the arrangement described above, the position of the recess formed in the lens holder 511 to accommodate one of the end portions of the elastic member 54 also differs from the position of the recess in the first embodiment. The other recess for accommodating the other end portion of the elastic member 54 is not formed in the lens holder 521 but in the inclination constituting section 522.

The other points in the second embodiment are the same as those in the first embodiment.

3.2 Effects

The pressing force that the wheel 61 exerts to the second holder 51 can be divided into a component of the force acting in the direction +Z and a component of the force acting in the direction -V. Out of the two components of the force, the component of the force acting in the direction +Z moves the second holder 52 in the direction +Z. In the first embodiment described above, the line of action of the component of the force exerted by the wheel 61 to the second holder 52 in the direction +Z and the line of action of the repulsive force that the elastic member 54 exerts to the second holder 52 are shifted in the first plane P1 from each other in the direction V. A couple around an axis parallel to the direction H is therefore produced in the inclination constituting section 522 of the second holder 52 in accordance with changes in the forces. When a couple around an axis parallel to the direction H is produced in the inclination constituting section 522 of the second holder 52, the second holder 52 is twisted, so that the attitude of the planoconcave cylindrical lens 152 changes. A change in the attitude of the planoconcave cylindrical lens 152 due to the twisted second holder 52 may contain a component of rotation around an axis parallel to the direction V.

In contrast, the elastic member 54 is disposed in a position through which the first straight line L1 passes in the second embodiment. The arrangement described above reduces the V-direction difference between the line of action of the +Z-direction component of the pressing force that the wheel 61 exerts to the second holder 52 and the line of action of the repulsive force that the elastic member 54 exerts to the second holder 52. The couple around an axis parallel to the direction H in the inclination constituting section 522 of the second holder 52 is therefore reduced. The amount of twist of the second holder 52 therefore decreases, so that a change in the attitude of the planoconcave cylindrical lens 152 decreases. Even when the attitude of the planoconcave cylindrical lens 152 changes, the component of rotation around an axis parallel to the direction V is reduced. A change in the wavelength of the light selected by the line narrowing module 14 is thus reduced.

Figure 5A:
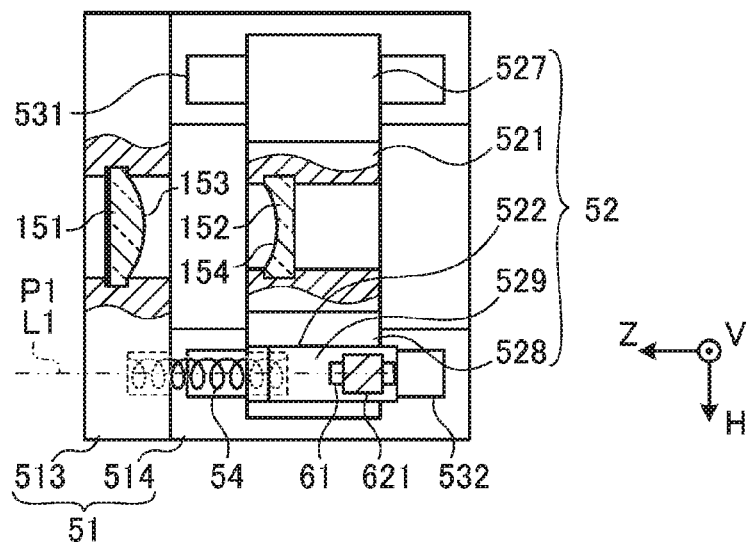
FIGS. 5A to 5C show a specific configuration of the spectral width changer in a third embodiment of the present disclosure.
Figure 5B:
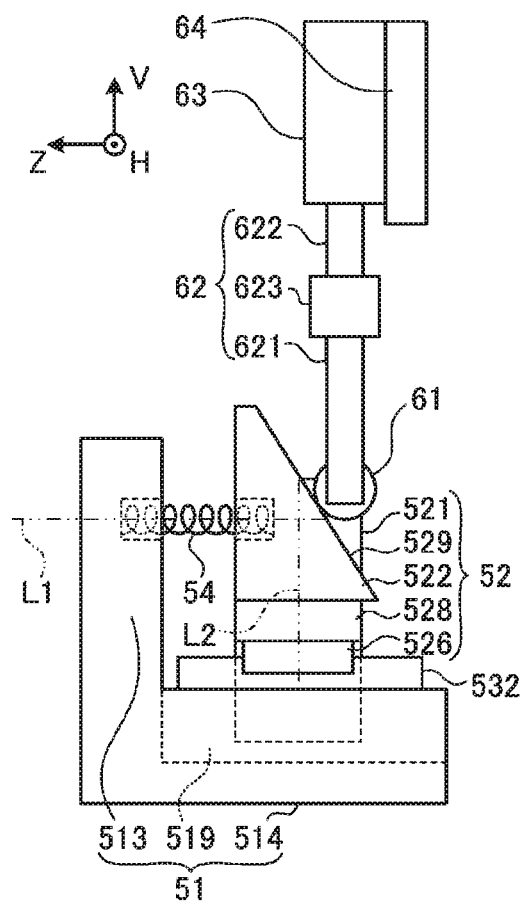
Figure 5C:
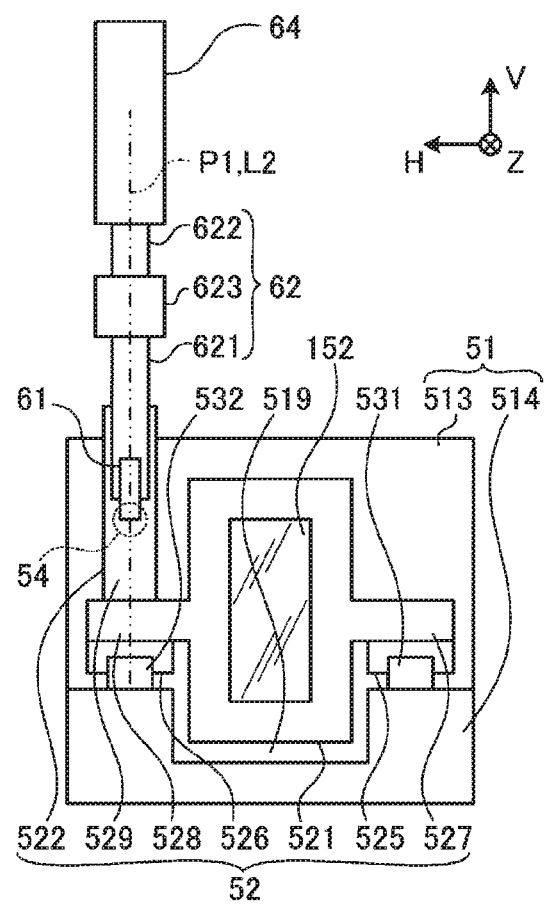

4. Moving Apparatus with Rails that Form Guide Section Disposed in First Plane 4.1 Configuration FIGS. 5A to 5C show a specific configuration of the spectral width changer 15 in a third embodiment of the present disclosure. FIG. 5A is a partial cross-sectional view of the spectral width changer 15 viewed along the direction -V and corresponds to a view of the spectral width changer 15 viewed in the same direction as in FIGS. 1, 2A, 3A, and 4A. FIG. 5B shows the spectral width changer 15 viewed along the direction -H and corresponds to a view of the spectral width changer 15 viewed in the same direction as in FIGS. 2B, 3B, and 4B. FIG. 5C shows the spectral width changer 15 viewed along the direction +Z and corresponds to a view of the spectral width changer 15 viewed in the same direction as in FIGS. 2C, 3C, and, 4C.

The spectral width changer 15 in the third embodiment differs from the spectral width changers 15 in the second embodiment in terms of the positions of the first rail 531 and the second rail 532.

In the spectral width changer 15 in the third embodiment, the first holder 51 includes a lens holder 513 and a rail holder 514. The first holder 51 is formed in a substantially L-letter shape formed of the lens holder 513 and the rail holder 514, as shown in FIG. 5B. The lens holder 513 is configured to hold an end portion of the planoconvex cylindrical lens 151. The rail holder 514 is configured to hold the first rail 531 and the second rail 532, which form the guide section. A groove 519 extending along the movement direction of the second holder 52 is formed in the rail holder 514.

The second holder 52 includes a first protrusion 527 and a second protrusion 528 on the -H-direction side and the +H-direction side of the lens holder 521, respectively, as shown in FIG. 5C. The first guide follower 525 and the second guide follower 526 are fixed to the -V-direction side of the first protrusion 527 and the -V-direction side of the second guide follower 526, respectively. The first guide follower 525 corresponds to a first section in the present disclosure, and the second guide follower 526 corresponds to a second section in the present disclosure. The inclination constituting section 522 is fixed to the +V-direction side of the second protrusion 528. The inclination constituting section 522 is so located as to be separate from the lens holder 521.

In the third embodiment, a straight line that intersects the inclination 529 and is parallel to the direction V is called a second straight line L2. The second straight line L2 is located in the first plane P1, as shown in FIG. 5C. FIGS. 5B and 5C show that the second straight line L2 intersects the inclination 529 at the center of the inclination 529, but not necessarily in the present disclosure. The second straight line L2 may be a straight line that intersects the inclination 529 in any position on the inclination 529 and is parallel to the direction V.

In the third embodiment, the second rail 532 is disposed in a position through which the first plane P1 passes.

Further, the second rail 532 is desirably disposed in a position through which the second straight line L2 passes.

The planoconcave cylindrical lens 152 is desirably located between the first guide follower 525 and the second guide follower 526.

The other points in the third embodiment are the same as those in the second embodiment.

4.2 Effects

In the second embodiment described above, the lens holder 521 of the second holder 52 is elastically deformed in some cases by the −V-direction component of the pressing force that the wheel 61 exerts to the inclination constituting section 522. When the lens holder 521 is elastically deformed, the attitude of the planoconcave cylindrical lens 152 changes. A change in the attitude of the planoconcave cylindrical lens 152 may contain a component of rotation around an axis parallel to the direction V.

In contrast, the second rail 532 is disposed in a position through which the first plane P1 passes in the third embodiment. The −V-direction component of the pressing force that the wheel 61 exerts to the inclination constituting section 522 can be received by the second rail 532 disposed in the position through the first plane P1 passes. Further, since the inclination constituting section 522 is fixed to the second protrusion 528 but is not directly fixed to the lens holder 521, elastic deformation of the inclination constituting section 522 affects the lens holder 521 only by a small amount. The elastic deformation of the lens holder 521 is thus suppressed, and a change in the attitude of the planoconcave cylindrical lens 152 is therefore suppressed.

In the third embodiment, the second rail 532 is disposed in a position through which the second straight line L2 passes. The couple around an axis parallel to the direction H in the inclination constituting section 522 of the second holder 52 is therefore reduced. The amount of elastic deformation of the inclination constituting section 522 and the second protrusion 528 therefore decreases, so that a change in the attitude of the planoconcave cylindrical lens 152 decreases.

In the third embodiment, the planoconcave cylindrical lens 152 is disposed between the first guide follower 525 and the second guide follower 526. The second holder 52 can therefore be supported in a position close to the center of gravity of the planoconcave cylindrical lens 152, whereby a change in the attitude of the planoconcave cylindrical lens 152 can be suppressed even when the second holder 52 is moved at high speed.

A change in the wavelength of the light selected by the line narrowing module 14 is thus reduced.

5. Others

Figure 6:
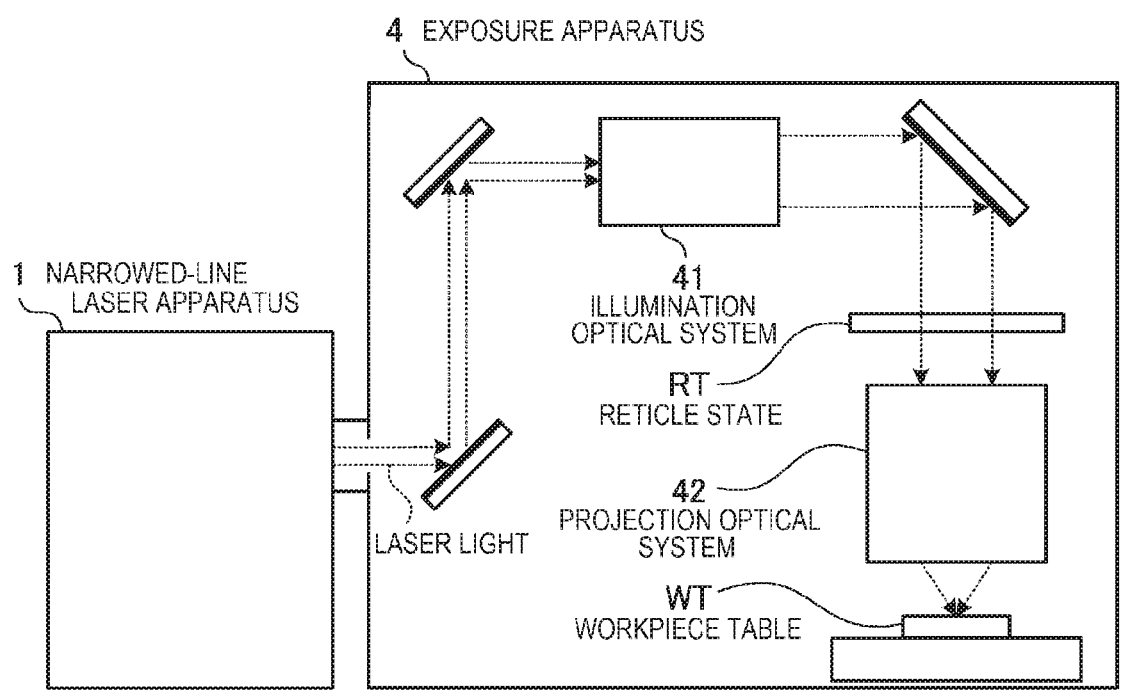
FIG. 6 schematically shows the configuration of an exposure apparatus connected to a narrowed-line laser apparatus.

FIG. 6 schematically shows the configuration of the exposure apparatus 4 connected to the narrowed-line laser apparatus 1. The narrowed-line laser apparatus 1 is configured to produce laser light as described above and output the produced laser light to the exposure apparatus 4.

In FIG. 6, the exposure apparatus 4 includes an illumination optical system 41 and a projection optical system 42. The illumination optical system 41 is configured to illuminate a reticle pattern on a reticle stage RT with laser light incident from the narrowed-line laser apparatus 1. The projection optical system 42 is configured to perform reduction projection on the laser light having passed through the reticle to cause the laser light to be focused on a workpiece that is not shown but is placed on the workpiece table WT. The workpiece is a light sensitive substrate on which a photoresist has been applied, such as a semiconductor wafer. The exposure apparatus 4 is configured to translate the reticle stage RT and the workpiece table WT in synchronization with each other to expose the workpiece with the laser light having reflected the reticle pattern. An electronic device can be manufactured by transferring a device pattern onto the semiconductor wafer in the exposure step described above.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An optical element moving apparatus comprising:
a first holder configured to hold a first optical element;
a second holder configured to hold a second optical element and having an inclined surface that is inclined with respect to a first direction directed from the second holder to the first holder;
a guide section configured to be capable of moving the second holder in a direction parallel to the first direction; and
an elastic member disposed in a position which is located between the first holder and the second holder and on a first plane intersecting the inclined surface at right angles and being parallel to the first direction,
wherein at least a part of the guide section is disposed on the first plane,
the guide section includes a first rail and a second rail held by the first holder,
the second holder includes a first section that moves along the first rail and a second section that moves along the second rail, and
the second optical element is held between the first section and the second section.

2. The optical element moving apparatus according to claim 1,
wherein the elastic member is disposed on a straight line being parallel to the first direction and intersecting the inclined surface.

3. The optical element moving apparatus according to claim 1,
wherein at least a part of the guide section is disposed on the first plane and a straight line perpendicular to the first direction and intersecting the inclined surface.

4. The optical element moving apparatus according to claim 1, wherein the first optical element is a cylindrical convex lens, the second optical element is a cylindrical concave lens, and a center axis of a cylindrical convex surface of the cylindrical convex lens and a center axis of a cylindrical concave surface of the cylindrical concave lens are in the first plane and parallel to a second direction perpendicular to the first direction.

5. An optical element moving apparatus, comprising:

a first holder configured to hold a first optical element;

a second holder configured to hold a second optical element and having an inclined surface that is inclined with respect to a first direction directed from the second holder to the first holder;

a guide section configured to be capable of moving the second holder in a direction parallel to the first direction;

an elastic member disposed in a position which is located between the first holder and the second holder and on a first plane intersecting the inclined surface at right angles and being parallel to the first direction;

a wheel;

a rod section configured to support the wheel; and an actuator configured to move the rod section in such a way that the wheel presses the inclined surface.

6. The optical element moving apparatus according to claim 5, wherein the actuator is configured to move the rod section in the first plane and in a second direction perpendicular to the first direction.

7. The optical element moving apparatus according to claim 5, wherein the elastic member is disposed on a straight line being parallel to the first direction and intersecting the inclined surface.

8. The optical element moving apparatus according to claim 5, wherein at least a part of the guide section is disposed on the first plane and a straight line perpendicular to the first direction and intersecting the inclined surface.

9. The optical element moving apparatus according to claim 5, wherein at least a part of the guide section is disposed on the first plane.

10. The optical element moving apparatus according to claim 9, wherein the guide section includes a first rail and a second rail held by the first holder, the second holder includes a first section that moves along the first rail and a second section that moves along the second rail, and the second optical element is held between the first section and the second section.

11. The optical element moving apparatus according to claim 5, wherein the first optical element is a cylindrical convex lens, the second optical element is a cylindrical concave lens, and a center axis of a cylindrical convex surface of the cylindrical convex lens and a center axis of a cylindrical concave surface of the cylindrical concave lens are in the first plane and parallel to a second direction perpendicular to the first direction.

* * * * *